(12) United States Patent
Sakuma et al.

(10) Patent No.: US 6,905,571 B2
(45) Date of Patent: Jun. 14, 2005

(54) WAFER POLISHING METHOD AND WAFER POLISHING APPARATUS IN SEMICONDUCTOR FABRICATION EQUIPMENT

(75) Inventors: Noriyuki Sakuma, Tokyo (JP); Kinji Tsunenari, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/693,952

(22) Filed: Oct. 28, 2003

(65) Prior Publication Data

US 2004/0132309 A1 Jul. 8, 2004

(30) Foreign Application Priority Data

Oct. 28, 2002 (JP) ........................................ 2002-312542

(51) Int. Cl.[7] ............................................. B24B 37/00
(52) U.S. Cl. ..................... 156/345.13; 134/114; 451/66
(58) Field of Search ....................... 156/345.13, 345.12; 134/114, 104.1; 451/66, 443, 444

(56) References Cited

U.S. PATENT DOCUMENTS 6,191,038 B1 * 2/2001 Yoshida et al. ............. 438/691
6,269,510 B1 * 8/2001 Beardsley et al. ............. 15/77
6,561,875 B1 * 5/2003 Homma et al. ................ 451/41
6,722,948 B1 * 4/2004 Berman ........................ 451/21

FOREIGN PATENT DOCUMENTS

| JP | 2000-202758 | 7/2000 |
| JP | 2001-252859 | 9/2001 |
| JP | 2002-086342 | 3/2002 |
| JP | 2000-117615 | 4/2003 |

* cited by examiner

Primary Examiner—P. Hassanzadeh
Assistant Examiner—Sylvia R. MacArthur
(74) Attorney, Agent, or Firm—Young & Thompson

(57) ABSTRACT

When honing an abrasive pad for polishing a wafer by rotating while closely contacting the wafer by bringing a conditioner into contact with the abrasive pad, forces applied from the abrasive pad to the conditioner are detected by a plurality of pressure detectors through a conditioner driving unit for holding the conditioner. The pressure detectors are respectively able to detect forces in two directions such as rotational direction and radial direction. A memory stores correlations between detection values and wafer polishing quantities under various conditioning terms. Therefore, it is determined whether the detection values are kept within acceptable limits stored in the memory. When the values are out of the acceptable limits, a controller controls the values so that they fall within the acceptable limits by properly changing conditioning terms.

8 Claims, 4 Drawing Sheets

Rotational Direction

WAFER POLISHING METHOD AND WAFER POLISHING APPARATUS IN SEMICONDUCTOR FABRICATION EQUIPMENT

BACKGROUND OF THE INVENTION

1. Field of the Invention

The present invention relates to a wafer polishing method and apparatus in semiconductor fabrication equipment, and more particularly to a wafer polishing apparatus and method capable of sufficiently controlling the polishing quantity of a wafer serving as a semiconductor substrate and continuously polishing the wafer at a stable polishing quantity.

2. Description of the Related Art

Various micro-fabrication techniques have been researched and developed in order to improve integration degree and functions of an LSI. Attention has been paid to a chemical mechanical polishing (hereinafter referred to as "CMP") technique which is one of the micro-fabrication techniques. The CMP is a polishing technique with a combination of a chemical action between an abrasive (slurry) and an object to be polished (wafer), and a mechanical action by abrasive grains in the slurry. This is technique useful in flattening an insulating film, forming a metallic plug, and forming an embedded wiring in a semiconductor fabrication process.

A wafer polishing apparatus for performing the CMP comprises a polishing surface plate (platen) to which an abrasive cloth (abrasive pad) is attached, a head for holding the back surface of a wafer in order to press the front surface of a wafer to be polished against the abrasive pad, a driving mechanism for relatively rotating the platen and wafer, and a supply mechanism for supplying slurry between the abrasive pad and wafer.

The abrasive pad is typically made of elastic polyurethane or the like. Because abrasion or loading occurs on the surface of the abrasive pad due to polishing, the abrasive pad is damaged and thereby, the polishing efficiency is deteriorated. For this reason, a conditioning mechanism is provided which presses a conditioner to which diamond is attached by electrodeposition against the surface of the abrasive pad performs honing at a proper timing before, after, or during a polishing step.

In a conventional conditioning method disclosed in Japanese Patent Laid-Open No. 2000-117615, fluctuations in polishing quantity are checked by polishing a dummy wafer, measuring film thicknesses before and after polishing the dummy wafer by a film thickness measuring instrument, and calculating a polishing quantity in accordance with the differences between the film thicknesses, when the predetermined number of wafers have been polished. When the calculated polishing quantity is out of a set range, conditioning is executed. However, the polishing quantity does not fall within the set range yet, conditioning is executed again by changing conditioning terms. Thus, polishing and conditioning of the dummy wafer are repeated until the polishing quantity falls within the set range through trial and error. In the case of this method, however, because it is necessary to regularly polish and examine the dummy wafer whenever the polishing is executed in predetermined times, lots of time and labor are necessary and this causes the wafer fabrication cost to increase.

Therefore, Japanese Patent Laid-Open No. 2000-202758 discloses a control method of the surface state of an abrasive pad using a mechanism in which a conditioner and the rotating shaft of a motor for rotating the conditioner are connected by a balanced spring. This is a method for detecting a deflection value and making the deflection value fall within a set range, based on the deflection of a rotating balanced spring due to a friction force when honing an abrasive pad. In this method, the honing force of an abrasive pad by a conditioner is obtained from a detected deflection value and quantitatively controlled. This method is particularly effective for initial conditioning when using a brand-new abrasive pad.

However, as described above, the method for detecting the friction force between a conditioner and an abrasive pad in accordance with the deflection value of a balanced spring has a problem that the sensitivity is too low. This is because a structure is used in which a balanced spring for being detected its deflection value is not easily deflected since it rotates together with a detection section and moreover, a pressure is applied. To efficiently hone an abrasive pad, it is preferable to increase the rotational speed of a conditioner and increase a pressure. However, when increasing the rotational speed of the conditioner, the balanced spring is more hardly deflected and the sensitivity is further deteriorated. To compensate the above phenomena, a soft balanced spring may be used. However, even in this case, the sensitivity is also deteriorated when the pressure of the conditioner increases. Moreover, when using the soft balanced spring, the balanced spring is more easily deformed due to the friction force when honing an abrasive pad and the torsion of the balanced spring is increased due to the rotation of the conditioner. Therefore, a problem occurs that not only the deflection of the balanced spring but also the torsion of the spring are detected and the surface state of the abrasive pad cannot be accurately detected. It is possible to electrically simply amplify a detection value in order to detect a very small deflection value of a balanced spring. In this case, however, because noises due to the rotation of the conditioner and abrasive pad increase and thereby, the detection accuracy of the surface state of the abrasive pad is deteriorated.

Thus, the above conventional method is effective even if the rotation of a conditioner increases and a large pressure is applied when a deflection value difference is large, for example, surface states (honed status) are greatly changed like when a present abrasive pad is changed to a brand-new abrasive pad. However, when the fluctuations in surface state are small, for example, while wafer polishing is continuously performed, it is difficult to detect a deflection value difference because it is too small and accurately confirm the surface state of an abrasive pad.

SUMMARY OF THE INVENTION

It is an object of the present invention to provide a wafer polishing apparatus and a method capable of polishing a wafer at a stable polishing quantity by accurately detecting the surface state of an abrasive pad, obtaining the polishing quantity of the wafer from the detection result in accordance with previously stored data, and controlling the polishing quantity so that it falls within a proper range.

To achieve the above object, a wafer polishing apparatus of the present invention has an abrasive pad, a platen which rotates while holding the abrasive pad, a head for rotating a wafer while holding and pressing the wafer against the abrasive pad, and conditioning mechanism for honing the abrasive pad. The conditioning mechanism has a conditioner for honing a wafer while contacting with the wafer, a conditioner driving unit for holding and rotating the conditioner, an arm for holding the conditioner driving unit, and a plurality of detectors each of which detects the force of a platen in the rotational direction and its force in the radial direction orthogonal to the rotational direction of the platen among the forces applied to the conditioner driving unit. A detector is set between the conditioner driving unit and the arm for supporting the conditioner driving unit and it is possible to detect the force in the rotational direction received by the conditioner contacting with the abrasive pad due to the rotation of the abrasive pad and the radial force generated due to the sweep of the arm.

In an embodiment of the present invention, a plurality of detectors includes a rotational directional pressure detector located between one side along the rotational direction of a platen, of a conditioner driving unit and an arm holding portion, and two radial directional pressure detectors located between the both sides along the radial direction of the platen, of the conditioner driving unit and the arm holding portion, and a fixing jig for holding the conditioner driving unit is provided between the other side along the rotational direction of the platen, of the conditioner driving unit and the arm holding portion. The arm holding portion is a hole into which the conditioner driving unit is inserted and the conditioner driving unit is held in the hole through the rotational directional pressure detector, two radial directional pressure detectors, and fixing jig.

Each detector includes at least one of a piezoelectric element, load cell, differential transformer, strain gauge, and semiconductor strain gauge.

Moreover, it is preferable that a memory is provided for storing a correlation between output value of the detector and polishing quantity of a wafer. Furthermore, it is preferable that a controller is provided for determining whether a detection value of the detector is kept in an allowable range and when the value is out of the allowable range, changes conditioning terms.

In a wafer polishing method of the present invention, a wafer rotates and is pressed against an abrasive pad, the abrasive pad is honed by a conditioner at a predetermined timing, and the rotational directional force of the abrasive pad and its radial force orthogonal to the rotational direction of the abrasive pad are detected, among the forces applied to a conditioner driving unit through the conditioner. Moreover, the method I characterized in when a value detected by a detector is out of the range of a force corresponding to a predetermined range of a polishing quantity of wafer, conditioning terms of the conditioner is changed so that the value detected by the detector falls within the range.

By previously storing two forces in two directions, the rotational direction and the radial direction orthogonal to the rotational direction, which work when conditioning the abrasive pad from the brand-new state up to the stable honed state under various conditioning terms (such as rotational speed of abrasive pad, conditioning pressure, and rotational speed and sweep speed of conditioner) in a computer (controller) together with the polishing quantity of a wafer, a correlation between conditioning terms and wafer polishing quantity. Thus, by previously obtaining a correlation between two forces in two directions working at the time of conditioning and wafer polishing quantity, it is possible to control a wafer polishing quantity so that a proper wafer polishing quantity can be obtained by automatically changing conditioning terms when the wafer polishing quantity gets out of a set range.

That is, by detecting two directional forces working between a conditioner driving unit and an arm and comparing the forces with previously stored data, an advantage is obtained that stable polishing can be performed by controlling a polishing quantity in real-time while continuously polishing a wafer. Moreover, because a conditioner normally sweeps from the margin of an abrasive pad up to the its center, it is possible to determine which position of the abrasive pad is a place where the polishing quantity is out of a predetermined value and change conditioning terms at only the place where the polishing quantity is out of the predetermined value. Therefore, an advantage is also obtained that the uniformity of the surface state of a wafer can be further improved.

According to the present invention, by separately detecting forces working on a conditioner in the rotational direction of an abrasive pad and its radial direction orthogonal to the rotational direction at the time of conditioning by brining the conditioner into contact with the abrasive pad, it is possible to detect the forces at a high sensitivity and high accuracy compared to the conventional method of detecting the deflection value of a rotating balanced spring.

Moreover, when the detection value gets out of predetermined acceptable limits, it is preferable to feed back to the conditioner terms so that the detection value falls within the acceptable limits by properly changing the conditioner terms. Thereby, it is possible to stably polish a wafer at a predetermined polishing quantity also when continuously polishing the wafer.

Particularly, when previously obtaining and storing correlations between detection values of a detector and wafer polishing quantities under various conditioning terms, it is possible to obtain a predetermined wafer polishing quantity by always monitoring detection values of the detector under conditioning and immediately optimizing a conditioning term when the detection value gets out of acceptable limits.

The above and other objects, features and advantages of the present invention will become apparent from the following description with reference to the accompanying drawings which illustrate examples of the present invention.

DETAILED DESCRIPTION OF THE PREFERRED EMBODIMENTS

First Embodiment

Figure 1:
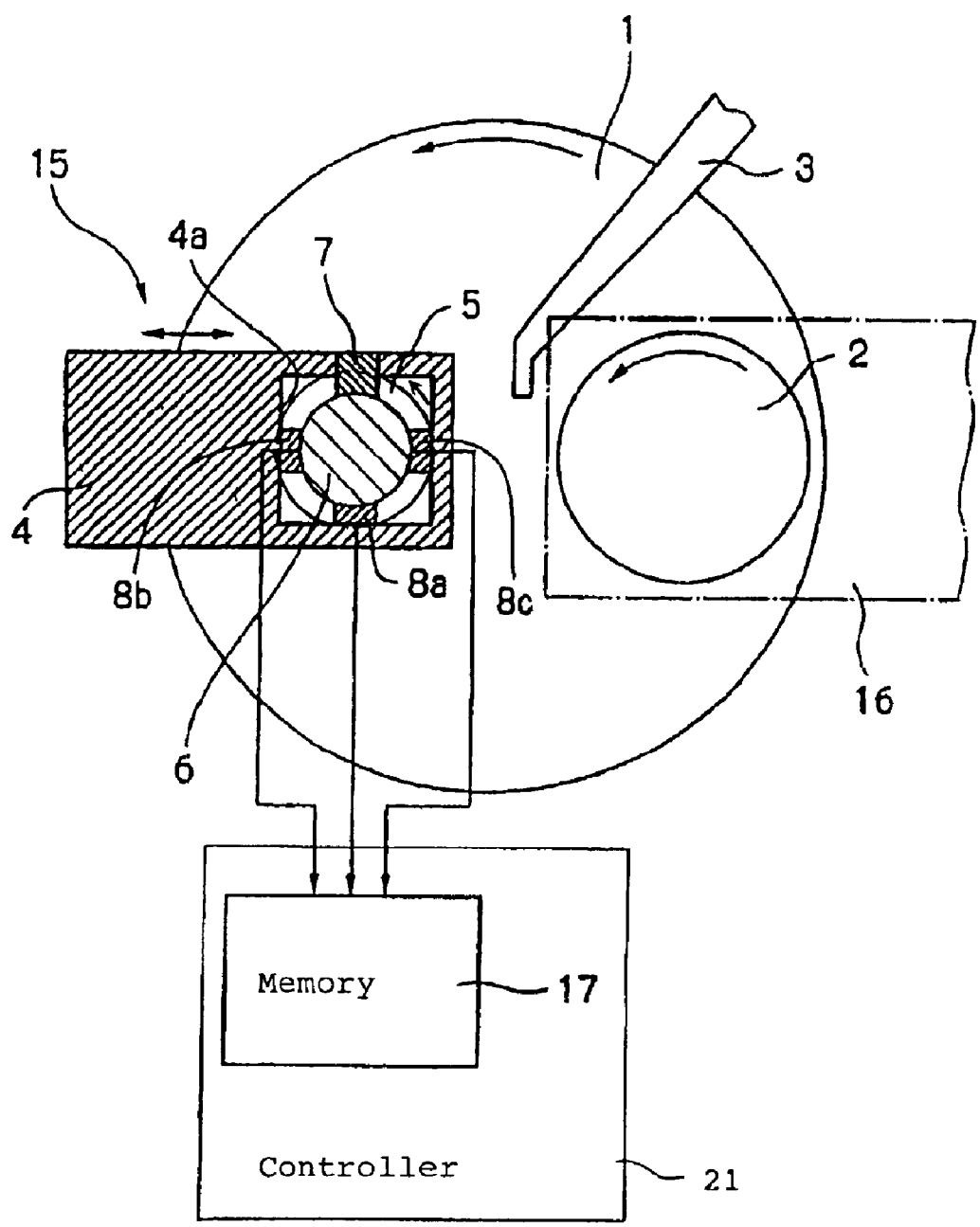
FIG. 1 is a schematic top view showing essential portions of a wafer polishing apparatus according to a first embodiment of the present invention.
Figure 2:
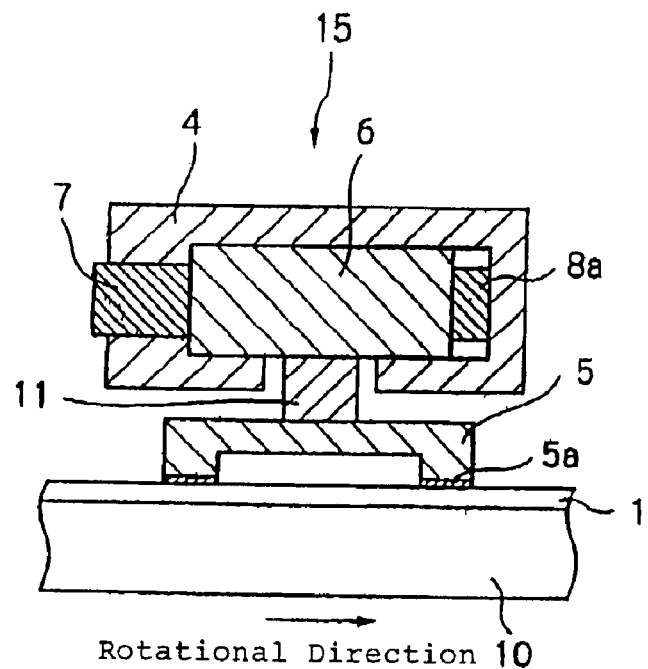
FIG. 2 is a schematic sectional view of a conditioning mechanism of the wafer polishing apparatus according to the first embodiment of the present invention.

The wafer polishing apparatus of the first embodiment of the present invention will be described below referring to FIGS. 1 and 2. FIG. 1 is a top view of the wafer polishing apparatus of the first embodiment. The wafer polishing apparatus has a circular platen 10, an abrasive pad 1 attached onto the platen 10, a wafer holding head 16 provided so as to face one part of the platen 10, a conditioning mechanism 15 provided so as to face the other part of the platen 10, and a nozzle 3. The abrasive pad 1 is made of elastic polyurethane or the like. The wafer holding head 16 holds the back surface of a wafer 2. The nozzle 3 supplies deionized water or slurry between the abrasive pad 1 and wafer 2. The conditioning mechanism 15 has a cantilever-shaped arm 4, a conditioner driving unit 6, a conditioner 5 held by the conditioner driving unit 6, a fixing jig 7, and three pressure detectors 8a to 8c. The arm 4 is able to relatively move against the platen 10. A diamond 5a is attached to the conditioner 5 by electrodeposition. The fixing jig 7 is located between the conditioner driving unit 6 and one side of the hole 4a along the rotational direction (circumferential direction) of the platen 10 to fix the unit 6 and one side of the hole 4a. Three pressure detectors 8a to 8c are provided between the conditioner driving unit 6 and three other sides of the hole 4a respectively. Among the pressure detectors 8a to 8c, the rotational directional pressure detector 8a is present at the position opposing the fixing jig 7 and two other detectors are radial directional pressure detectors 8b and 8c. The conditioner driving unit 6 is held in the hole (holding portion) 4a provided in the arm 4 so as to be movable in the range in which the unit 6 does not escape from the arm 4. Moreover, when a force is applied to the conditioner driving unit 6, the force can be transmitted to the pressure detectors 8a to 8c. The pressure detectors 8a to 8c are connected so as to be respectively able to transmit a detection value to a controller 21 including a memory 17. Moreover, though not illustrated, the controller 21 of this embodiment is connected to the driving mechanism (not illustrated) of the wafer 2, the platen 10, and arm 4, and conditioner driving unit 6. Therefore, the controller 21 can control operations of the platen 10, arm 4, wafer 2, and conditioner 5.

Figure 3:
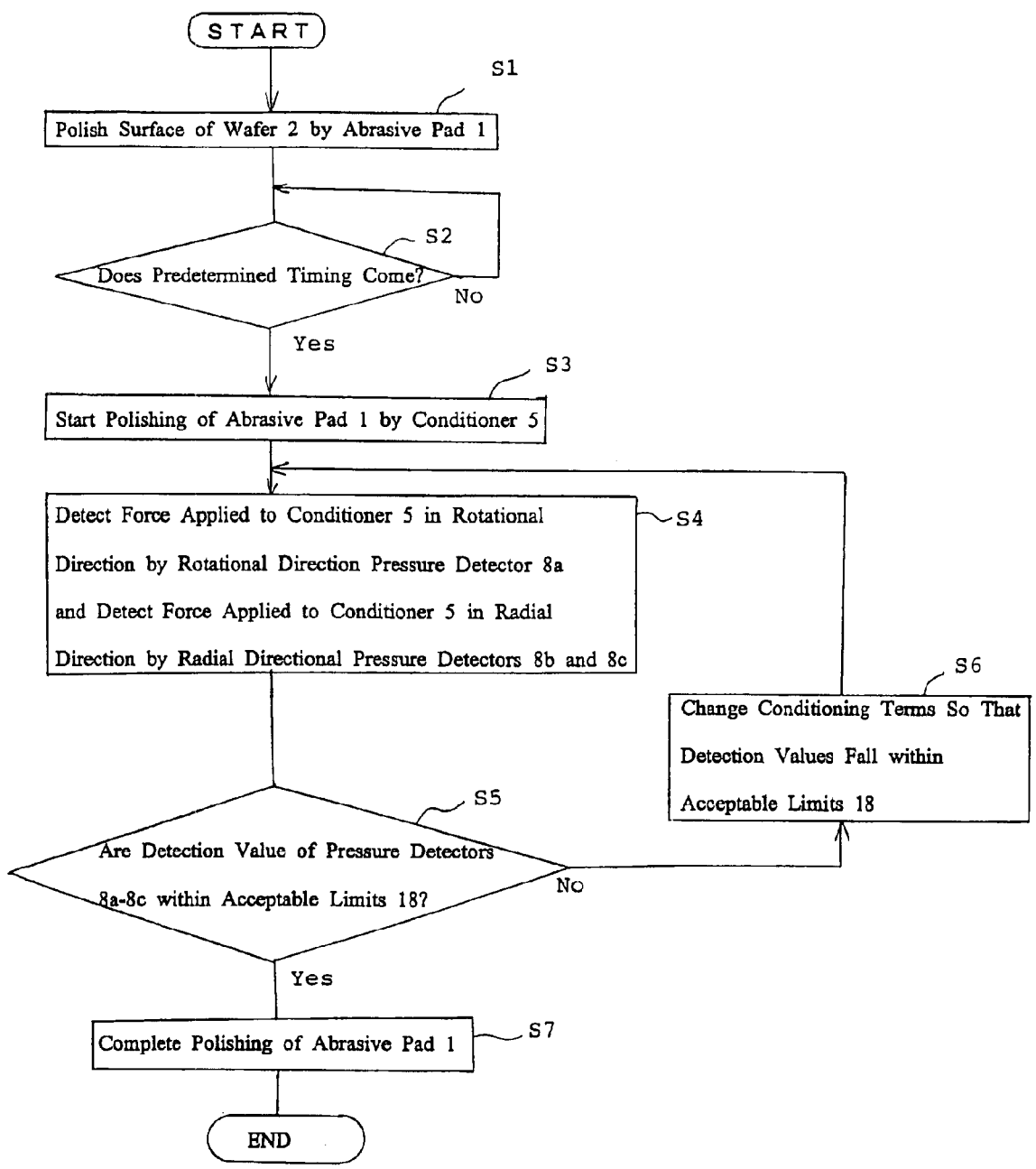
FIG. 3 is a flowchart showing a wafer polishing method by the wafer polishing apparatus according to the first embodiment of the present invention.

A method for polishing the wafer 2 by the wafer polishing apparatus is described below referring to the flowchart in FIG. 3. The wafer holding head 16 presses the wafer 2 against the abrasive pad 1 on the platen 10 and the nozzle 3 supplies deionized water or slurry onto the platen 10. Thereby, the platen 10, abrasive pad 1, and wafer 2 rotate in the same direction. Thus, the surface of the wafer 2 is polished by the abrasive pad 1 (step S1).

When repeating the above polishing of the wafer 2, abrasion or loading occurs on the abrasive pad 1 and the polishing efficiency is deteriorated. Therefore, when a proper timing comes (step S2), honing (conditioning) of the abrasive pad 1 is started (step S3). Specifically, the arm 4 lowers to press the conditioner 5 against the abrasive pad 1 on the platen 10 and the conditioner driving unit 6 rotates the conditioner 5 in the same direction as those of the platen 10 and abrasive pad 1. Thereby, the diamond 5a is attached on the surface of the conditioner 5 by electrodeposition polishes the surface of the abrasive pad 1 made of polyurethane or the like. Moreover, the arm 4 reciprocates (sweeps) between the margin and the center of the abrasive pad 1 in the radial direction orthogonal to the rotational direction of the platen 10 and thereby, the entire surface of the abrasive pad 1 is polished.

Unless polishing states are entirely uniform when conditioning the abrasive pad 1 by the conditioner 5, the surface state of the abrasive pad 1 becomes ununiform and thereby, polishing of the wafer 2 by the abrasive pad 1 may be deteriorated. Polishing states under conditioning are changed due to various factors including the rotational speed of the platen 10 and the pressure of the conditioner 5. Therefore, it is preferable to make the surface state of the abrasive pad 1 uniform and then uniformly polish the wafer 2 by always monitoring a force applied to the conditioner 5 under conditioning and thereby controlling conditioning terms.

This embodiment uses three pressure detectors as described above, that is, the rotational directional pressure detector 8a for detecting a force applied to the conditioner 5 in the rotational direction (circumferential direction) of the platen 10 and the radial directional pressure detectors 8b and 8c for respectively detecting a force applied to the conditioner 5 in the direction (radial direction of the platen 10) orthogonal to the rotational direction. Therefore, it is possible to detect the rotational directional force received by the conditioner 5 contacting with the abrasive pad 1 due to the rotation of the abrasive pad 1 due to the rotation of the abrasive pad 1 and the radial force generated due to the sweep of the arm 4. The pressure detectors 8a to 8c may be piezoelectric elements.

Specifically, by pressing the conditioner 5 against the abrasive pad 1 while the platen 10 rotates and rotating the conditioner 5 in the same direction as the platen 10, a force is applied to the conditioner 5 in the rotational direction of the abrasive pad 1. Moreover, the conditioner driving unit 6 connected to the conditioner 5 through a rotating shaft 11 receives the above force and is pressed against the inner surface of the hole 4a of the arm 4. Because the rotational direction pressure detector 8a serving as a piezoelectric element is provided between the conditioner driving unit 6 and arm 4, the rotational directional pressure detector 8a detects the force by which the conditioner driving unit 6 is pressed against the arm 4. At the same time, because the arm 4 sweeps, the force orthogonal to the rotational direction (radial direction) of the abrasive pad 1 is also applied to the conditioner 5. Same as the above description, the conditioner driving unit 6 is receives the above force and is pressed against the inside of the hole 4a of the arm 4 and the radial directional pressure detectors (piezoelectric elements) 8b and 8c between the conditioner driving unit 6 and arm 4 detect the force by which the conditioner driving unit 6 is pressed against the arm 4 (step S4). Though the sweep of the arm 4 is reciprocative movement, it is also possible to detect the force applied in accordance with the forward movement of the arm 4 and the force applied in accordance with the returning movement of the arm 4.

That is, forces work on the conditioner 5 in the rotational direction of the abrasive pad 1 (rotational direction of the platen 10) and the sweep direction (radial direction) of the arm 4 respectively under conditioning. In this embodiment, these two directional forces are detected by three pressure detectors 8a to 8c. In this case, the force for pressing the conditioner driving unit 6 against the arm 4 is detected. This is a force applied to the conditioner 5 by the abrasive pad 1 and is based on a force applied to the abrasive pad 1 by the conditioner 5 under conditioning. Moreover, in this case, the force and polishing quantity when the abrasive pad 1 conditioned by the conditioner 5 polishes the wafer 2 are estimated in accordance with forces detected by the pressure detectors 8a to 8c.

Therefore, when previously obtaining detection values of three pressure detectors 8a to 8c corresponding to a desired wafer polishing quantity, it is possible to conform whether a desired wafer polishing quantity is obtained by monitoring detection values of the pressure detectors 8a to 8c. In this embodiment, acceptable limits 18 (refer to FIG. 4) of detection values of three pressure detectors 8a to 8c corresponding to the acceptable limits of a wafer polishing quantity is previously obtained and stored in the memory 17 of the controller 21. Then, the controller 21 confirms whether detection values of three pressure detectors 8a to 8c are within the acceptable limits 18 stored in the memory 17 under actual conditioning (step S5). When the detection values are out of the acceptable limits 18, a wafer polishing quantity is too large or too small. Therefore, the controller 21 controls not-illustrated driving mechanisms of each member (platen 10, arm 4, and wafer 2) and the conditioner driving unit 6 and changes conditioning terms (rotational speed of abrasive pad 1, pressure for conditioning, and sweep speed of arm 4) (step S6). Thereafter, conditioning is completed (step S7) so that detection values fall within the acceptable limits 18.

Figure 4:
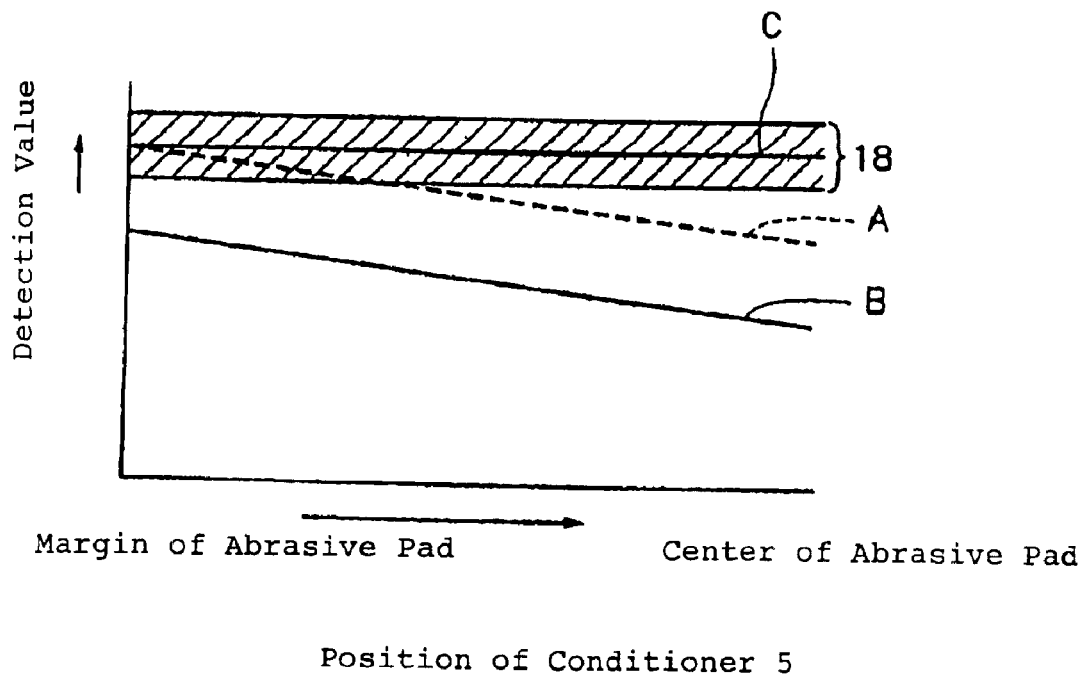
FIG. 4 is a graph showing a correlation between position of a conditioner on an abrasive pad and detection value by a detector.

Specifically, when conditioning the abrasive pad 1 under constant conditioning terms, detection values of the pressure detectors 8a to 8c are small at the center of the abrasive pad 1 compared to the margin of the pad 1 as shown by the broken line A in FIG. 4. Therefore, a portion of the wafer 2 polished by the center of the abrasive pad 1 is small in polishing quantity compared to a portion polished by the margin of the abrasive pad 1. This is because when the abrasive pad 1 rotates at a constant rotational speed, the relative speed at the margin of the abrasive pad 1 is different from the relative speed at the its center and the rotational speed of the pad 1 decreases toward its center. A wafer polishing quantity naturally depends on a portion to be polished between the margin and the center of the abrasive pad 1 thus conditioned. The same trend as the above description appears in the case of the brand-new abrasive pad 1 shown by the continuous line B in FIG. 4 and in the case of the abrasive pad 1 whose detection value rises after conditioned as shown by the broken line A.

Therefore, the controller 21 gradually changes conditioning terms as the arm 4 sweeps toward the center of the abrasive pad 1 so that detection values of the pressure detectors 8a to 8c become constant, as shown at straight line C. According to circumstances, instead of keeping a honing amount of the abrasive pad 1 constant, it is considered to increase the honing magnitude of the surface of the abrasive pad 1 toward its center. In any case, conditioning terms are decided so that detection values of the pressure detectors 8a to 8c may fall within the acceptable limits 18 set around the predetermined value shown by the straight line C. Moreover, in the following conditioning steps, detection values of the pressure detectors 8a to 8c are always monitored and when a detection value gets out of the acceptable limits 18 because the conditioner 5 is deteriorated due to a chip of the diamond 5a attached to the conditioner 5 by electrodeposition, or the like, the controller 21 properly changes conditioning terms so that the detection value falls within the acceptable limits 18.

Correlations between detection values of the pressure detectors 8a to 8c and the polishing quantity of a wafer when polishing the wafer by the conditioner 5 are previously obtained through actual measurement to set the acceptable limits 18 shown in FIG. 4. The correlations between detection values of the pressure detectors 8a to 8c and wafer polishing quantity are previously obtained on various conditioning terms (such as, rotational speed of abrasive pad 1, pressure for conditioning, and sweep speed of arm 4). Thereby, a change degree of any term is immediately known by comparing wafer polishing quantities under each term when one of detection values of the pressure detectors 8a to 8c gets out of the acceptable limits 18. Therefore, when one of detection values of the pressure detectors 8a to 8c gets out of the acceptable limits 18, the controller 21 can improve a wafer polishing quantity by automatically changing conditioning terms.

Thus, according to this embodiment, a wafer polishing quantity can be controlled in accordance with detection values of the pressure detectors 8a to 8c. Therefore, it is possible to previously set conditioning terms so that a wafer polishing quantity becomes proper and properly change conditioning terms as the conditioner 5 is deteriorated so that a desired wafer polishing quantity can be obtained. Moreover, when the processing time until detection values of the pressure detectors 8a to 8c reach the acceptable limits 18 is greatly lengthened or the detection values cannot reach the acceptable limits 18, it is possible to exchange members at a proper timing by accurately confirming the service life of the conditioner 5. Moreover, by optimizing the rotational speed and pressure of the conditioner 5 and the sweep speed of the arm 4, it is possible to efficiently condition the brand-new abrasive pad 1 up to a predetermined surface state in a short time.

The above conditioning is performed immediately after exchanging the abrasive pad 1 and before or after the polishing step of the wafer 2 or during the polishing step. When the wafer 2 is polished, loading or insufficient honing of the abrasive pad 1 occurs. Because loading or insufficient honing of the abrasive pad 1 depends on the contact time with the wafer 2, it differs in portions in the abrasive pad 1. In this case, detection values of the pressure detectors 8a to 8c are decreased at the portion where loading or insufficient honing occurs. Therefore, when one of detection values gets out of each of the acceptable limits 18, it is possible to dissolve loading or insufficient honing in real-time by changing conditioning terms only at the portion. Thereby, even if the wafer 2 is continuously polished, it is possible to perform stable polishing without decreasing a polishing quantity or deteriorating uniformity.

When the wafer 2 is polished, it is rotated by the wafer holding head 16. Therefore, the center and the margin of the wafer 2 are different in speed and polishing quantity at a constant rotational speed the same as the abovementioned case of the abrasive pad 1 and thus, the uniformity of the surface state may be deteriorated. Therefore, when a position for polishing the wafer 2 on the abrasive pad 1 is almost decided, conditioning terms are set so that the surface of the abrasive pad 1 is more honed toward a portion for polishing the wafer 2 nearby its center. In this case, desired detection values of the pressure detectors 8a to 8c and the acceptable limits around the desired detection values are set so that the values and the acceptable limits are changed not to be constant as shown by the straight line C in FIG. 4. Thus, this makes possible to improve the uniformity in the plane of the wafer 2 and effectively use the abrasive pad 1.

As described above, the controller 21 is constituted so as to be able to properly change various conditioning terms such as the rotational speed and pressure under conditioning of the abrasive pad 1 and the sweep speed of the arm 4. However, the controller 21 may be constituted so as to be able to change a specific one of or only a small number of various conditioning terms. In this case, the controller 21 may be connected to only mechanisms for driving members relating to changeable conditioning terms. Moreover, the controller 21 may be an apparatus for calling user's attention by emitting a warning sound or warning sign when one of detection values of the pressure detectors 8a to 8c gets out of the acceptable limits 18. In this case, the controller 21 is not connected to mechanisms for driving other members. Whenever the controller 21 emits a warning sound or warning sign, a user adjusts mechanisms for driving members to change conditioning terms. The memory 17 may be built in the controller 21 or provided as an independent apparatus outside of the controller 21.

Second Embodiment

Figure 5:
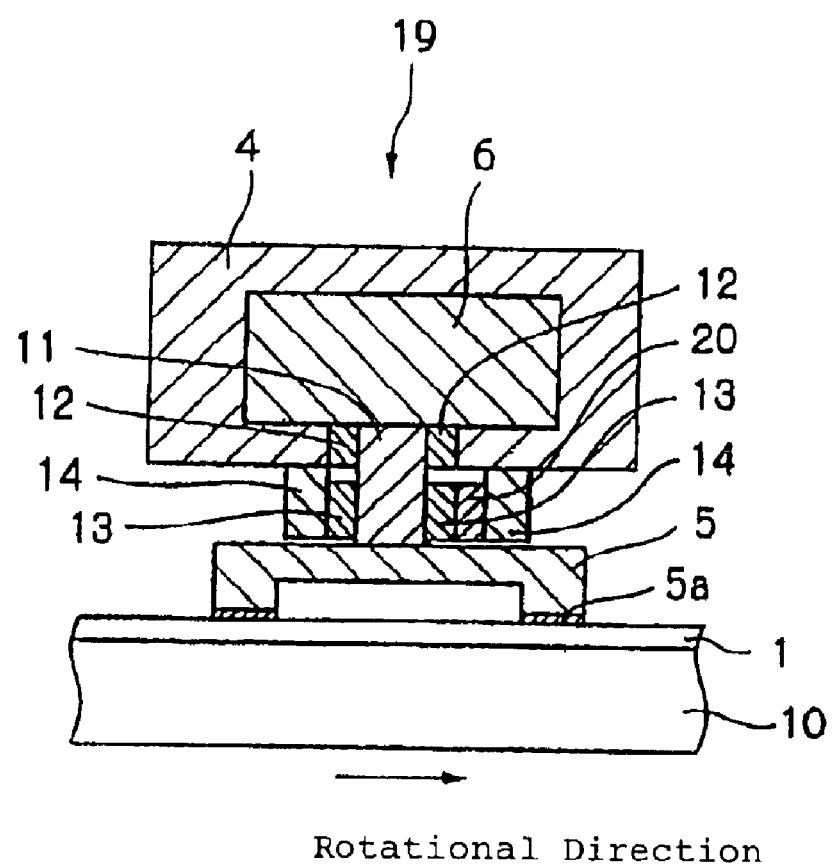
FIG. 5 is a schematic sectional view of a conditioning mechanism of a wafer polishing apparatus according to a second embodiment of the present invention.

Then, a second embodiment of the present invention will be described below referring to FIG. 5. A portion same as that of the first embodiment is provided with the same reference number and its description is omitted.

A conditioning mechanism 19 of this embodiment is constituted so that a rotating shaft 11 for connecting a conditioner 5 with a conditioner driving unit 6 is supported by an upper rotation bearing 12 and a lower rotation bearing 13 in order to further improve the detection sensitivity. The upper rotation bearing 12 is fixed to the conditioner driving unit 6 and an arm 4 by screws. The lower rotation bearing 13 is connected to the arm 4 through a piezoelectric element serving as a pressure detector 20 by a lower rotation bearing fixing plate 14. A force working on the conditioner 5 under conditioning is obtained by detecting the deflection of the rotating shaft 11 by the pressure detector 20 between the lower rotation bearing fixing plate 14 and the lower rotation bearing 13. It is also preferable that the pressure detector 20 is provided at three positions in the rotational direction of the abrasive pad 1 and the direction orthogonal to its rotational direction the same as the first embodiment.

Though the above two embodiments respectively use a piezoelectric element as a pressure detector, it is also possible to use one of various apparatuses such as a load cell and a differential transformer as long as the apparatus can detect a force. Moreover, it is possible to use a strain gauge or a semiconductor strain gauge as a pressure detector for detecting a force working on the conditioner 5, which is attached nearby the portion for fixing the conditioner driving unit 6 to the arm 4. Furthermore, together with the detected value of such a pressure detector, it is possible to obtain a change of torque currents with time of the conditioner 5 and use the change of toque currents with time as auxiliary data.

Moreover, in the above description, a case is shown in which the arms 4 of the conditioning mechanisms 15 and 19 linearly reciprocate from the margin of the abrasive pad 1 toward its center. However, a detector may be comparatively freely (universally) attached to the arm 4 so as to be able to detect a pressure in the direction orthogonal to the traveling direction of the abrasive pad 1 even if the moving method of the arm 4 differs.

While preferred embodiments of the present invention have been described using specific terms, such description is for illustrative purposes only, and it is to be understood that changes and variations may be made without departing from the spirit or scope of the following claims.

What is claimed is:

1. A wafer polishing apparatus comprising:

an abrasive pad;

a platen for holding and rotating said abrasive pad;

a head for holding a wafer and rotating the wafer while pressing the wafer against the abrasive pad; and conditioning mechanism for honing the abrasive pad including a conditioner for honing the pad in contact therewith, a conditioner driving unit for holding and rotating the conditioner, an arm for holding the conditioner driving unit, and a plurality of detectors each detecting a force in the rotational direction of the platen and a force in the radial direction orthogonal to the rotational direction of the platen among forces applied to the conditioner driving unit, wherein said detectors each includes a rotational directional pressure detector located between one side along the rotational direction of the platen, of the conditioner driving unit and the holding portion of the arm, and two radial directional pressure detectors located between the both sides along the radial direction of the platen, of the conditioner driving unit and the holding portion of the arm, and a fixing jig for holding the conditioner driving unit is provided between the other side along the rotational direction of the platen, of the conditioner driving unit and the holding portion of the arm.

2. The apparatus according to claim 1, wherein the holding portion of said arm is a hole into which the conditioner driving unit is inserted, and said conditioner driving unit is held in the hole through the rotational directional pressure detector, the two radial directional pressure detectors, and the fixing jig.

3. The apparatus according to claim 2, further comprising a memory for storing correlations between output values of said detectors and polishing quantities of said wafer.

4. The apparatus according to claim 3, further comprising a controller which determines whether detection values of said detectors are within acceptable limits and when any one of the values is out of the limits, changing conditioning terms.

5. The apparatus according to claim 1, further comprising a memory for storing correlations between output values of said detectors and polishing quantities of said wafer.

6. The apparatus according to claim 5, further comprising a controller which determines whether detection values of said detectors are within acceptable limits and when any one of the values is out of the limits, changing conditioning terms.

7. The apparatus according to claim 2, further comprising a controller which determines whether detection values of said detectors are within acceptable limits and when any one of the values is out of the limits, changing conditioning terms.

8. The apparatus according to claim 1, further comprising a controller which determines whether detection values of said detectors are within acceptable limits and when any one of the values is out of the limits, changing conditioning terms.

* * * * *